United States Patent
Itoga et al.

(10) Patent No.: US 7,999,400 B2
(45) Date of Patent: Aug. 16, 2011

(54) SEMICONDUCTOR DEVICE WITH RECESSED REGISTRATION MARKS PARTIALLY COVERED AND PARTIALLY UNCOVERED

(75) Inventors: Takashi Itoga, Nara (JP); Yasuyuki Ogawa, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 270 days.

(21) Appl. No.: 11/884,450

(22) PCT Filed: Jan. 30, 2006

(86) PCT No.: PCT/JP2006/301490
§ 371 (c)(1),
(2), (4) Date: Aug. 16, 2007

(87) PCT Pub. No.: WO2006/103825
PCT Pub. Date: Oct. 5, 2006

(65) Prior Publication Data
US 2009/0206495 A1 Aug. 20, 2009

(30) Foreign Application Priority Data
Mar. 25, 2005 (JP) .................................. 2005-089808

(51) Int. Cl.
*H01L 23/544* (2006.01)
(52) U.S. Cl. .................. 257/797; 257/E23.179; 438/401; 438/455; 438/456; 438/457; 438/458; 438/459; 438/462; 250/559.44; 702/150
(58) Field of Classification Search .................. 257/797, 257/E23.179, 734, 782, 686, 777, 778; 438/401
See application file for complete search history.

(56) References Cited

U.S. PATENT DOCUMENTS

| | | | |
|---|---|---|---|
| 5,637,187 A | 6/1997 | Takasu et al. | |
| 5,909,627 A | 6/1999 | Egloff | |
| 6,067,062 A | 5/2000 | Takasu et al. | |
| 6,455,944 B1 | 9/2002 | Kato et al. | |
| 6,555,925 B1 * | 4/2003 | Higashi et al. | 257/797 |
| 6,787,923 B2 * | 9/2004 | Tan et al. | 257/779 |

(Continued)

FOREIGN PATENT DOCUMENTS

JP 4-362924 A 12/1992

(Continued)

OTHER PUBLICATIONS

International Search Report for PCT/JP2006/301490 mailed Apr. 25, 2006 (English and Japanese).

(Continued)

*Primary Examiner* — N Drew Richards
*Assistant Examiner* — John P Dulka
(74) *Attorney, Agent, or Firm* — Nixon & Vanderhye P.C.

(57) ABSTRACT

A semiconductor device and a method for manufacturing such semiconductor device are provided. Specifically, in the semiconductor manufacture, a recessed alignment mark is formed on a front plane of a high distortion point glass substrate as a target for alignment for bonding, and the recessed alignment mark is permitted to have a shape which extends to an external side of the semiconductor device. Thus, excellent bonding between the high distortion point glass substrate and the semiconductor device can be provided, and at the same time, since the recessed alignment mark is not sealed, the bonding state can be maintained even when the high distortion point glass substrate is exposed under the high temperature condition after bonding the semiconductor device.

9 Claims, 4 Drawing Sheets

U.S. PATENT DOCUMENTS

| | | | |
|---|---|---|---|
| 2002/0182821 A1* | 12/2002 | Yabe et al. | 438/401 |
| 2003/0179551 A1* | 9/2003 | Sugimoto et al. | 361/748 |
| 2004/0032637 A1 | 2/2004 | Imamura | |
| 2004/0061176 A1* | 4/2004 | Takafuji et al. | 257/347 |
| 2006/0246619 A1 | 11/2006 | Imamura | |
| 2009/0095956 A1 | 4/2009 | Takafuji et al. | |

FOREIGN PATENT DOCUMENTS

| | | | |
|---|---|---|---|
| JP | 08153772 A * | 6/1996 | |
| JP | 09148206 A * | 6/1997 | |
| JP | 10284812 A * | 10/1998 | |
| JP | 2002-244587 A | 8/2002 | |
| JP | 2004-006632 | 1/2004 | |
| JP | 2004-165600 | 6/2004 | |
| JP | 2005166900 A * | 6/2005 | |
| WO | 03/100753 | 12/2003 | |

OTHER PUBLICATIONS

Notification of Reasons for Refusal mailed Apr. 19, 2011 in Japanese Application No. 2007-510328, with English Translation (6 pages).

* cited by examiner

SEMICONDUCTOR DEVICE WITH RECESSED REGISTRATION MARKS PARTIALLY COVERED AND PARTIALLY UNCOVERED

This application is the US national phase of international application PCT/JP2006/301490 filed 30 Jan. 2006, which designated the U.S. and claims priority to JP 2005-089808 filed 25 Mar. 2005, the entire content of each of which is hereby incorporated by reference.

TECHNICAL FIELD

The technology presented herein relates to semiconductor apparatuses such as an active matrix-type display device, and manufacturing methods of such semiconductor apparatuses.

BACKGROUND ART

Conventionally, the bonding of a semiconductor chip or optical element chip (hereinafter, referred to as a "chip") on a substrate involves aligning the chip on a predetermined position. In order to improve accuracy of alignment, various apparatuses and methods have been proposed. As an example of such conventional apparatuses and methods, an alignment index is formed on at least one of a chip surface and a substrate surface (see Patent Publication 1: Japanese Laid-Open Patent Publication No. 8-83955 (published on Mar. 26, 1996), for example).

In the apparatus and method of Patent Publication 1, an alignment index is formed that is defined by an inclined plane with respect to the chip surface and/or substrate surface, and the inclined plane defining a hole or trench is completely covered with the chip or substrate surface when the chip is mounted on the substrate. This creates a sealed space between the inclined plane and the chip or substrate surface. In some cases, the substrate with the chip bonded thereon is processed under high temperature conditions. Here, if there is a sealed space between the substrate and the chip, the temperature of the gas trapped in the space raises during the high-temperature process and the pressure therein is increased. The problem of the apparatus and method described in Patent Publication 1, then, is that the increased pressure in the sealed space created by the inclined plane defining the alignment index acts to detach the chip from the substrate.

DISCLOSURE

The example embodiment presented herein was made in view of the foregoing problem, and a feature of the example embodiment is to provide a semiconductor apparatus and a manufacturing method thereof, in which the force of detaching the chip from the substrate does not act even under high temperature conditions and in which bonding between the substrate and the chip can thus be maintained.

In order to solve the foregoing problem, the example embodiment provides a semiconductor apparatus including an insulating substrate and a semiconductor device bonded to a surface of the insulating substrate, wherein: the surface of the insulating substrate includes a recessed portion formed as an alignment mark for position registration of the semiconductor device; and the recessed portion is provided over a region covered with the semiconductor device and a region not covered with the semiconductor device.

With this construction, a semiconductor apparatus is realized in which the force of detaching the chip from the insulating substrate does not act even under high temperature conditions and in which bonding between the insulating substrate and the chip can thus be maintained. Specifically, the recessed portion formed on the surface of the insulating substrate of a semiconductor apparatus of the present invention is provided over a region covered with the semiconductor device and a region not covered with the semiconductor device. With this construction, at least part of the recessed portion formed on the surface of the insulating substrate includes a region not covered with the semiconductor device.

In a semiconductor apparatus of the example embodiment structured as above, the space formed by the recessed portion used as an alignment mark is in communication with outside through the region not covered with the semiconductor device, when the semiconductor device is bonded to the surface of the insulating substrate. Through this region, the gas in the recessed portion can be released out of the space. A semiconductor apparatus of the example embodiment therefore does not have the problem of conventional semiconductor apparatuses, which occur when the semiconductor apparatus is subjected to a high temperature process with the semiconductor device bonded on the surface of the insulating substrate, causing the gas in the closed space between the insulating substrate and the semiconductor device to expand and adversely affect the bonding between the insulating substrate and the semiconductor device.

In a conventional semiconductor apparatus including an alignment mark formed of a metal film, no closed space is formed between the insulating substrate and the semiconductor device. However, owning to the thickness of the metal film, raised portions are formed on the substrate surface. Such raised portions can be an inhibiting factor of the bonding between the substrate surface and the semiconductor device.

In contrast, in a semiconductor apparatus of the example embodiment, the recessed portion formed on the substrate surface is used as an alignment mark for position registration of the semiconductor device. The recessed portion is not an inhibiting factor of the bonding between the surface of the insulating substrate and the semiconductor device. Further, because the recessed alignment mark is easy to form, the fabrication steps of the semiconductor apparatus can be simplified in the bonding and subsequent steps.

As used herein, "provided over a region covered with the semiconductor device and a region not covered with the semiconductor device" refers to the arrangement where the continuous space defined by the recessed portion extends beyond the semiconductor device with the semiconductor device bonded to the surface of the insulating substrate.

The recessed portion in a semiconductor apparatus of the example embodiment can be formed, for example, by partially etching the surface of the insulating substrate. The semiconductor device may use a monocrystalline silicon substrate as a base material. The semiconductor device may be one fabricated using a monocrystalline silicon substrate as a base material and by performing ion implantation before bonded to the substrate surface, and detaching the base material from the semiconductor device by heat treatment after bonding, using the ion implanted surface as a boundary. The ion implantation may be performed with hydrogen, noble gas, or the like.

A manufacturing method of a semiconductor apparatus of the example embodiment is a method for manufacturing a semiconductor apparatus including an insulating substrate and a semiconductor device bonded to a surface of the insulating substrate, the method including: a recessed portion forming step of forming a recessed portion on the insulating substrate, the recessed portion being formed as an alignment mark for position registration of the semiconductor device;

and a bonding step of bonding the semiconductor device on the surface of the insulating substrate so that at least part of the recessed portion defines a region not covered with the semiconductor device.

In other words, a manufacturing method of a semiconductor apparatus of the example embodiment is a method for manufacturing a semiconductor apparatus including a semiconductor circuit device bonded to a substrate, wherein the method forms a recessed portion on the substrate to provide an alignment mark for position registration of the semiconductor circuit device, and bonds the semiconductor circuit device on the substrate such that at least part of the recessed portion defines a region not covered with the semiconductor circuit device.

With the foregoing manufacturing method, a semiconductor apparatus can be fabricated in which the recessed portion is provided over a region covered with the semiconductor device and a region not covered with the semiconductor device.

Additional features, and strengths of the example embodiment presented herein will be made clear by the description below. Further, the advantages of the example embodiment will be evident from the following explanation in reference to the drawings.

BRIEF DESCRIPTION OF DRAWINGS

FIG. 6(b) is a cross sectional view showing a manufacturing step of a substrate including a non-monocrystalline thin film transistor and a monocrystalline thin film transistor.

FIG. 6(c) is a cross sectional view showing a manufacturing step of a substrate including a non-monocrystalline thin film transistor and a monocrystalline thin film transistor.

FIG. 6(d) is a cross sectional view showing a manufacturing step of a substrate including a non-monocrystalline thin film transistor and a monocrystalline thin film transistor.

FIG. 6(e) is a cross sectional view showing a manufacturing step of a substrate including a non-monocrystalline thin film transistor and a monocrystalline thin film transistor.

FIG. 6(f) is a cross sectional view showing a manufacturing step of a substrate including a non-monocrystalline thin film transistor and a monocrystalline thin film transistor.

FIG. 6(g) is a cross sectional view showing a manufacturing step of a substrate including a non-monocrystalline thin film transistor and a monocrystalline thin film transistor.

FIG. 6(h) is a cross sectional view showing a manufacturing step of a substrate including a non-monocrystalline thin film transistor and a monocrystalline thin film transistor.

FIG. 6(i) is a cross sectional view showing a manufacturing step of a substrate including a non-monocrystalline thin film transistor and a monocrystalline thin film transistor.

The following will describe one example embodiment.

[Substrate (through bonding step)]

A semiconductor apparatus of the example embodiment includes a semiconductor device bonded to a surface of a substrate. The substrate surface has recessed portions formed as alignment marks for position registration of the semiconductor device. The recessed portions are formed over a region covered with the semiconductor device and a region not covered by the semiconductor device.

The substrate may be, for example, a high-distortion-point glass substrate or crystallized glass. The substrate may include various types of layers or elements formed thereon. Such a substrate will also be referred to as simply a "substrate." As the base of the semiconductor device, a substrate such as a monocrystalline silicon substrate or a gallium arsenide substrate may be used, for example.

The recessed portions are alignment marks for positioning the semiconductor device on a predetermined position of the substrate surface, and are formed in portions to be bonded with the semiconductor device. The recessed portions may be formed by etching a part of the substrate surface or by beam trenching or the like. The shape and depth of the recessed portions are not particularly limited as long as the recessed portions can sufficiently serve as alignment marks according to the type of substrate and semiconductor device used. For example, when the substrate is a high-distortion-point glass substrate, recessed portions with a depth of about 200 nm to 300 nm are formed. The shape of recessed portions as viewed from the normal line direction of the substrate surface in which recessed portions are formed is not particularly limited. For example, the recessed portions may have an "L" or "T" shape.

It is preferable that the recessed portions (alignment marks) be formed not only on the substrate surface of the semiconductor apparatus but on a surface of the semiconductor device as well. By mating these alignment marks, the semiconductor device can readily be positioned at a predetermined position to ensure easy bonding with the substrate.

The recessed portions are formed over a region covered with the semiconductor device and a region not covered with the semiconductor device. This means that the recessed portions are continuously formed to extend over a region covered with the semiconductor device and a region not covered with the semiconductor device. The ratio of covered and uncovered regions in the recessed portions is not particularly limited. However, since the recessed portions are generally formed as alignment marks, the recessed portions are generally formed such that the proportion of the covered region by the semiconductor device is greater in a state where the semiconductor device is bonded on the substrate.

[Manufacturing Method of Semiconductor Apparatus]

A manufacturing method of a semiconductor apparatus of the example embodiment presented herein is a method for manufacturing a semiconductor apparatus including a semiconductor device bonded on a substrate, and the method includes the step of forming recessed portions on the substrate to provide alignment marks for position registration of the semiconductor device, and the step of bonding the semiconductor device on the substrate in such a manner that at least a part of the recessed portions is not covered with the semiconductor device.

The step of forming the recessed portions on the substrate may be performed by conventional methods. For example, the recessed portions may be formed by etching part of the substrate surface or by beam processes or the like.

The step of bonding the semiconductor device on the substrate in such a manner that at least a part of the recessed portions is not covered with the semiconductor device may be performed as follows. For example, a marker is formed that allows the semiconductor device to be positioned on a predetermined position of the substrate surface. With the marker, the semiconductor device can be properly positioned by placing a periphery of the semiconductor device on a predetermined position of the recessed alignment marks. The semiconductor device so positioned on a predetermined position of the substrate surface can then be bonded with the substrate using conventional bonding methods. The recessed alignment marks need to be formed on the substrate side. The semiconductor device is formed by conventional methods and is planarized by the CMP method.

EXAMPLE

The following will describe the example embodiment presented herein in more detail based on an Example. The description below merely relates to an Example of the example embodiment, and the example embodiment is not limited in any way by the following description.

[Fabrication of Bonding Substrate]

Prior to bonding with the semiconductor device, the bonding substrate is fabricated according to the steps below. In this Example, the term "bonding substrate" is used to refer to a substrate with various members.

Figure 1A:
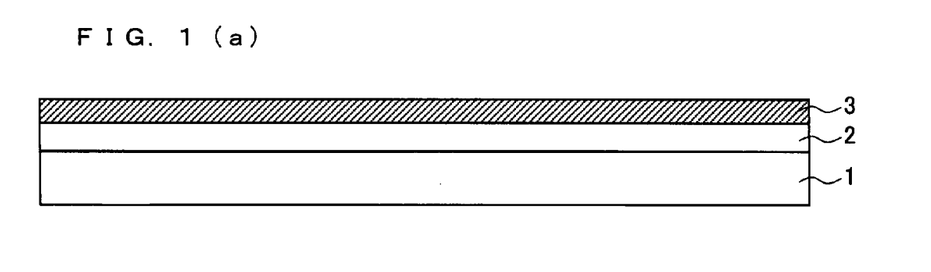
FIG. 1(a) is a cross sectional view showing part of a manufacturing flow of a bonding substrate according to an example embodiment.

In this Example, a high-distortion-point glass substrate (substrate) 1 was used as the substrate. As shown in FIG. 1(*a*), an undercoat film 2 made of silicon dioxide, and an amorphous silicon film 3 were formed on a surface of the high-distortion-point glass substrate 1, with the thickness of 200 nm and 50 nm, respectively. Other than silicon dioxide, silicon oxynitride (SiON) or the like may be used as the material of the undercoat film 2.

The amorphous silicon film 3 formed on the surface of the high-distortion-point glass substrate 1 was crystallized into a non-monocrystalline silicon film 4 by irradiation of a laser beam or other forms of energy beam, according to procedures used in thin film transistor fabrication. This was followed by patterning of the non-monocrystalline silicon film 4.

Here, in addition to the silicon film or the like formed in portions to be transistors, a reference alignment mark (non-monocrystalline silicon film) 7 is also formed on the undercoat film 2 to provide a substrate-side reference position on the high-distortion-point glass substrate 1. Like the non-monocrystalline silicon film 4, the reference alignment mark 7 was also formed by crystallizing the non-monocrystalline silicon film 3.

Figure 1B:
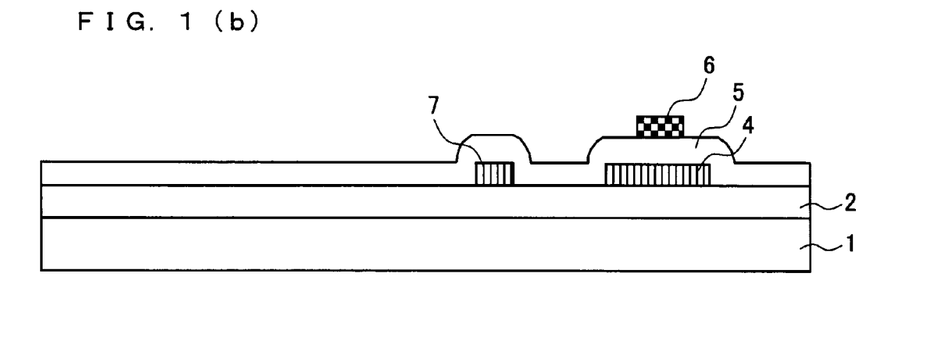
FIG. 1(b) is a cross sectional view showing part of a manufacturing flow of a bonding substrate according to an example embodiment.

Next, a gate insulating film 5 made of silicon dioxide was formed to a thickness of 100 nm on the undercoat film 2 on which the non-monocrystalline silicon film 4 and the reference alignment mark 7 had been formed. Then, a gate metal film 6 of tungsten was formed to a thickness of about 300 nm and this was followed by patterning. FIG. 1(*b*) shows a cross section of a resulting structure of the bonding substrate. Other than tungsten, tantalum or the like may be used as the material of the gate metal film 6.

Figure 1C:
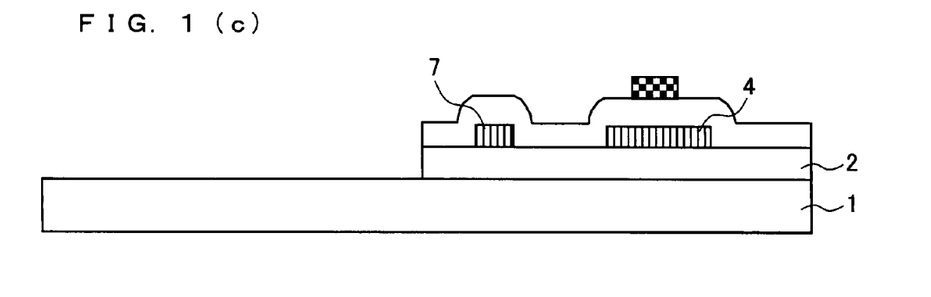
FIG. 1(c) is a cross sectional view showing part of a manufacturing flow of a bonding substrate according to an example embodiment.

Thereafter, the bonding substrate was etched in portions to be bonded with the semiconductor device. FIG. 1(*c*) shows a cross section of a resulting structure. The etching method is not particularly limited. For example, the gate insulating film 5 and the undercoat film 2 may be etched using buffered hydrofluoric acid.

Then, recessed alignment marks (recessed portions) 8 for aligning the semiconductor device were formed on the high-distortion-point glass substrate 1, in predetermined portions of the bonding substrate, as shown in FIG. 1(*d*). The recessed alignment marks 8 are formed using the reference alignment mark 7 as a reference. In this Example, the substrate is a high-distortion-point glass substrate made of high-distortion-point glass, and as such etching was made using buffered hydrofluoric acid. When other substrates are used, etching may be performed by means as appropriately selected according to the type of substrate used.

Figure 1D:
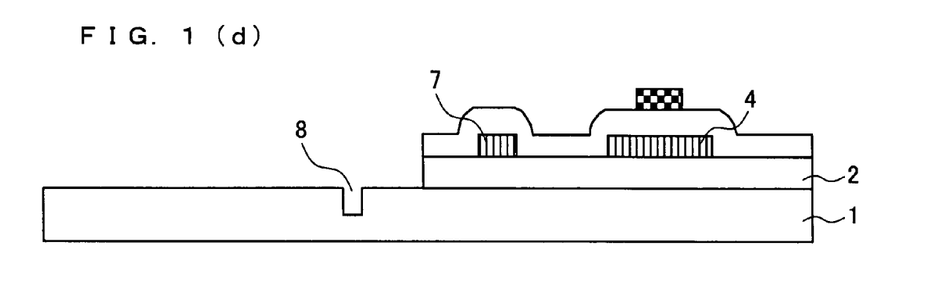
FIG. 1(d) is a cross sectional view showing part of a manufacturing flow of a bonding substrate according to an example embodiment.

As an example of etching using buffered hydrofluoric acid as in this Example, recessed alignment marks 8 with a depth of 250 nm are formed by etching the high-distortion-point glass substrate 1 for 120 seconds at 25° C., using 10:1 buffered hydrofluoric acid. In this Example, etching was performed under these conditions, in order to form recessed alignment marks 8 that can sufficiently serve as alignment marks.

This is the end of a flow (a series of steps) for the fabrication of the bonding substrate to be bonded with the semiconductor device.

Figures 5A, 5B:
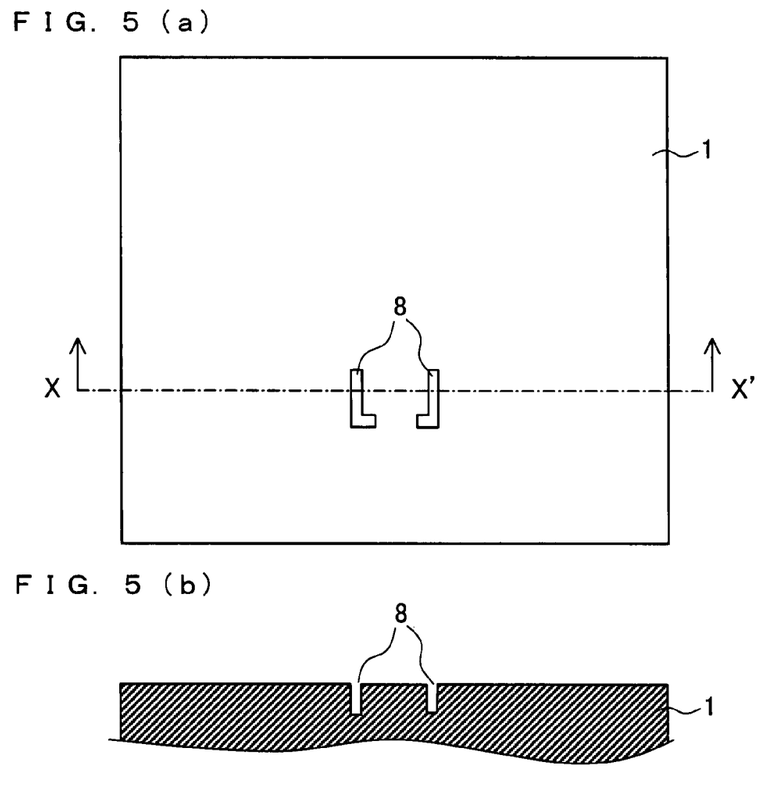
FIG. 5(a) is a schematic plane view of a semiconductor apparatus of an example embodiment, as viewed from a normal line direction of a substrate surface in which recessed alignment marks are formed.
FIG. 5(b) is a cross sectional view showing the alignment marks formed on the substrate, taken along the line X-X' of FIG. 5(a).

FIGS. 5(*a*) and 5(*b*) schematically illustrate the appearance of the recessed alignment marks 8 formed on the bonding substrate. FIG. 5(*a*) is a plane view schematizing the recessed alignment marks 8 as viewed from the normal line direction of the high-distortion-point glass substrate 1 with respect to the surface with the recessed alignment marks 8. As shown in FIG. 5(*a*), two recessed alignment marks 8 were formed one in the form of an "L" and the other an inverted "L." The two recessed alignment marks 8 were formed with a predetermined distance in between, with straight portions parallel to each other along the lengthwise direction, and short straight portions that lay substantially on the same line along the short side. The shape of the recessed alignment marks 8 shown in FIG. 5 is merely an exemplary shape of the alignment marks of the present invention. In other words, the present invention is not limited to the shape shown in FIG. 5.

FIG. 5(*b*) is a cross section taken along the line X-X' of FIG. 5(*a*). As shown in FIG. 5(*b*), the recessed alignment marks 8 of the present Example are trenches each having sides substantially perpendicular to the plane of the high-distortion-point glass substrate 1, and a bottom substantially parallel to the high-distortion-point glass substrate 1.

Note that, FIG. 5 is a merely schematic representation of the recessed alignment marks 8, showing the depth of the recessed alignment marks 8 for illustrative purposes. As such, in FIG. 5, the recessed alignment marks 8 are shown in different scales in a direction along the depth (depth direction) and a direction along the sides. That is, in FIG. 5, the depth of the recessed alignment marks 8 is exaggerated and it appears greater than it actually is.

[Fabrication of Semiconductor Device]

Figure 2:
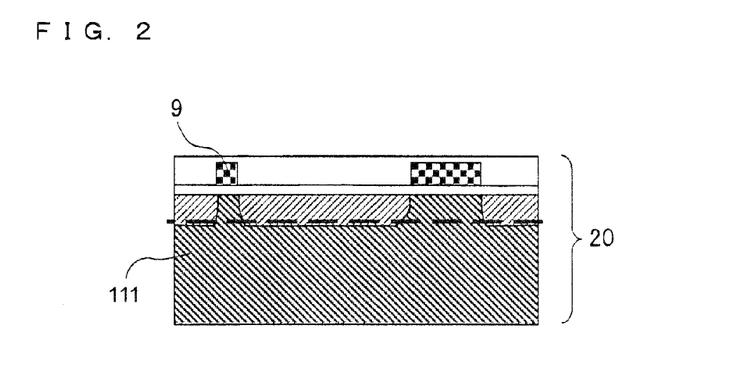
FIG. 2 is a cross sectional view schematically illustrating an exemplary structure of a semiconductor device before it is bonded to a surface of a bonding substrate, according to an example embodiment.

The following will describe an example of a semiconductor device bonded with the substrate formed as above. FIG. 2 is a cross sectional view schematically showing a structure of a semiconductor device bonded with the substrate according to this Example. A semiconductor device 20 as one example of the semiconductor device has the structure schematically represented in FIG. 2. As shown in FIG. 2, the semiconductor device 20 has alignment marks 9 for the semiconductor device 20, in addition to portions to be transistors. The alignment marks 9 are provided for bonding with the substrate. The dotted line depicts the line along which a base portion 111 of the semiconductor device 20 is detached from the rest of the semiconductor device 20.

[Bonding Step]

Figure 3:
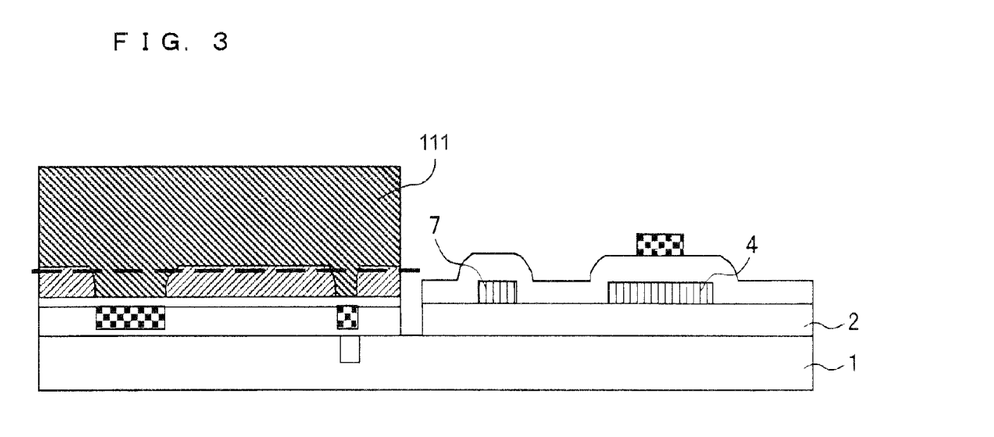
FIG. 3 is a cross sectional view schematically illustrating an exemplary structure of a semiconductor apparatus after it is bonded to the bonding substrate, according to an example embodiment.

FIG. 3 is a cross section schematically showing a structure of the semiconductor apparatus of the present Example in which the semiconductor device is bonded on the substrate surface. As shown in FIG. 3, in the semiconductor apparatus of this Example, bonding is made using the alignment marks 9 for the semiconductor device 20 aligned with the alignment marks 8 formed on the high-distortion-point glass substrate 1.

Figure 4:
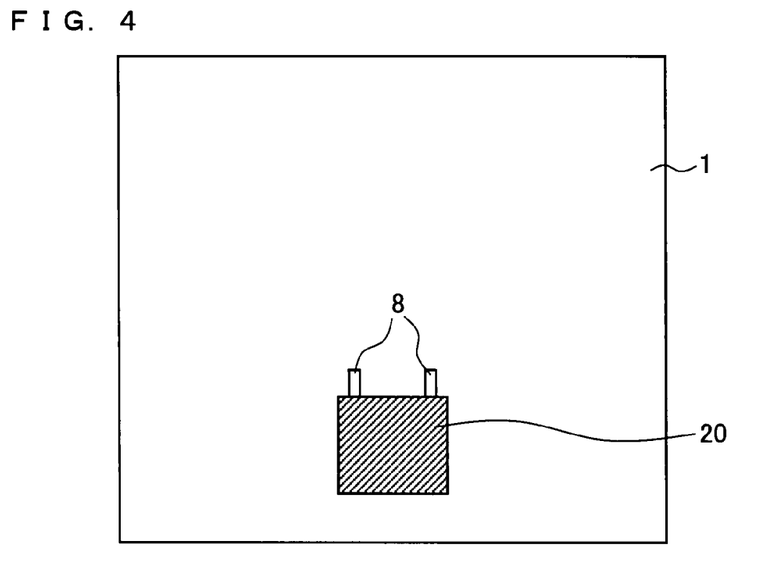
FIG. 4 is a plane view schematically illustrating a semiconductor apparatus of the embodiment shown in FIG. 3, as viewed from a normal line direction of a high-distortion-point glass substrate 1.

FIG. 4 is a plane view schematizing the semiconductor apparatus of the example embodiment shown in FIG. 3, as viewed from the normal line direction of the high-distortion-point glass substrate 1. As shown in FIG. 4, the alignment marks 8 for the bonding substrate are formed such that the alignment marks 8 partially extend from the periphery (edge) of the semiconductor device 20 in the order of micrometers, when the semiconductor apparatus of this Example is viewed from above the bonding substrate (in the normal line direction with respect to the plane of the high-distortion-point glass substrate 1). The alignment marks 8 are formed this way so that the portions (regions) of the recessed alignment marks 8 formed on the surface of the high-distortion-point glass substrate 1 will not be sealed completely by the semiconductor device 20. With this structure, the bonding between the high-distortion-point glass substrate 1 and the semiconductor device 20 will not be adversely affected by the expansion of sealed gas, which may occur when the bonding substrate having been bonded with a semiconductor circuit substrate is subjected to a high-temperature process.

After bonding, the substrate is heat-treated at temperatures of about 400° C. to 600° C. By the heat treatment, the supporting portion (base portion) of the monocrystalline semiconductor device is detached from the ion-implanted surface formed by ion implantation of hydrogen or noble gas on the monocrystalline semiconductor device.

[Transistor Fabrication Step]

The bonding and detaching step is performed after the fabrication of the thin film transistors by the deposition technique has proceeded to the gate electrodes. As such, the substrate with the non-monocrystalline thin film transistor and the monocrystalline thin film transistor are fabricated after this step, through various steps including the step of forming an interlayer insulating film, contact holes, and a source-drain metallization film.

Referring to FIG. 6(a) through FIG. 6(i), the following describes fabrication steps of the substrate including the non-monocrystalline thin film transistor and the monocrystalline thin film transistor.

According to the fabrication steps described below, a semiconductor apparatus is realized in which the MOS-(Metal Oxide Semiconductor) type non-monocrystalline Si thin film transistor and the MOS-type monocrystalline Si thin film transistor are mounted on different regions of the insulating substrate, and which can be suitably used for high-performance and multi-functional purposes. The semiconductor apparatus is mounted on a TFT active-matrix substrate.

The MOS-type thin film transistor is a common transistor which includes an active semiconductor layer, a gate electrode, a gate insulating film, and high-density impurity doped portions (source-drain electrode) formed on the both sides of the gate, and in which the gate electrode modulates the carrier density of the semiconductor layer beneath the gate to control a source-drain current flow. The MOS-type transistor has characteristics suitable for low power consumption logic, because, when provided in a CMOS (Complementary Metal Oxide Semiconductor) structure, it consumes small power and can produce full output according power supply voltages.

As shown in FIG. 6(i), a semiconductor apparatus 120 of the present embodiment includes: a $SiO_2$ (silicon oxide) film 103; a MOS-type non-monocrystalline Si thin film transistor 101a having a non-monocrystalline Si thin film 105' made of polycrystalline silicon; a MOS-type monocrystalline Si thin film transistor 116a having a monocrystalline Si thin film 114a; and metal leads 122. All of these members are formed on an insulating substrate 102.

As the insulating substrate 102, a high-distortion-point glass, code 1737 (alkali earth-alumino borosilicate glass) of Corning was used.

The $SiO_2$ film 103 has a thickness of about 50 nm and is formed over the entire surface of the insulating substrate 102. The MOS-type non-monocrystalline Si thin film transistor 101a having the non-monocrystalline Si thin film 105' includes: a $SiO_2$ film 104 provided as a protective insulating film; the non-monocrystalline Si thin film 105'; a $SiO_2$ film 107 provided as a gate insulating film; and a gate electrode 106. The gate electrode 106 is formed of polycrystalline silicon and W-silicide. Alternatively, the gate electrode 106 may be made of polycrystalline silicon and other silicides or polysides, etc.

The monocrystalline Si thin film transistor 116a is formed, via the gate insulating film 107, on the insulating substrate 102 on which the non-monocrystalline Si thin film transistor 101a has been formed. The monocrystalline Si thin film transistor 116a includes: a planarizing layer having a gate electrode 112; a $SiO_2$ film 113 provided as a gate insulating film for the monocrystalline Si transistor; and a monocrystalline silicon thin film 114a. The gate electrode 112 is made of heavily doped polycrystalline Si film and W-silicide. Alternatively, the gate electrode 112 may be solely made of polycrystalline Si, or refractory metals or silicide. The material of the gate electrode 112 is suitably selected taking into account necessary resistance and heat resisting property.

The bonding of the monocrystalline Si thin film transistor 116a with the insulating substrate 102 is made by bonding a monocrystalline Si substrate 110a, or more specifically, a base portion 111 and portions of the base portion 111 to be transferred as the gate electrode 112, the gate insulating film 113, and the monocrystalline Si thin film 114a onto the insulating substrate 102. After the monocrystalline Si thin film transistor 116a is mounted on the insulating substrate 102, the base portion 111 is detached to form the monocrystalline Si thin film transistor 116a. By forming the thin film transistor by first forming the gate electrode 112 and other members on the base portion 111 and then detaching the base portion 111, the micro processes of the monocrystalline Si thin film can be performed more easily as compared with the case where the thin film transistor is formed of the monocrystalline Si thin film formed on the insulating substrate 102.

That is, fabrication of the monocrystalline Si thin film transistor 116a preferably proceeds first by ion implantation of the monocrystalline Si thin film transistor 116a formed on the base portion 111 made of monocrystalline silicon, prior to bonding with the surface of the insulating substrate 102, and, after bonding, detaching the monocrystalline Si thin film transistor 116a from the ion-implanted surface by heat treatment.

As described above, in the semiconductor apparatus 120 fabricated by the present transistor fabrication steps, the MOS-type non-monocrystalline Si thin film transistor 101a and the MOS-type monocrystalline Si thin film transistor 116a are formed on the same substrate, i.e., the insulating substrate 102. As a result, a high-performance and multi-functional semiconductor apparatus can be obtained that includes a plurality of circuits with different characteristics. Such a high-performance and multi-functional semiconductor apparatus can be obtained less expensively as compared with the case where transistors all formed of monocrystalline Si thin films are mounted on the insulating substrate 102.

In the case where at least one of the metals selected from Ni, Pt, Sn, or Pd is added to the non-monocrystalline Si film to promote crystal growth, the region of the non-monocrystalline Si thin film 105' and the region of the monocrystalline Si thin film 114a may be separated from each other by the distance of at least 0.3 μm, or preferably at least 0.5 μm. This prevents the metal atoms such as Ni, Pt, Sn, or Pd from diffusing into the monocrystalline Si thin film 114a, thereby stabilizing the characteristics of the monocrystalline Si thin film transistor 116a.

In the semiconductor apparatus 120, the $SiO_2$ film 104 is formed as a protective insulating film between the non-monocrystalline Si thin film transistor 101a and the monocrystalline Si thin film transistor 116a. This prevents contamination of the monocrystalline Si thin film 114a.

When the semiconductor apparatus 120 is mounted on an active matrix substrate of a liquid crystal display device for example, there are additionally provided SiNx (silicon nitride), a resin planarizing film, via holes, and transparent electrodes, in order to realize liquid crystal display. In the region of the non-monocrystalline Si thin film 105', a driver and TFTs for a display section are formed. A timing controller is formed in the region of the monocrystalline Si thin film 114a, which can accommodate high-performance devices.

In this manner, the function and use of the thin film transistors made from the monocrystalline Si thin film 114a and the non-monocrystalline Si thin film 105' are decided according to their respective characteristics. As a result, high-performance and multi-functional thin film transistors can be obtained.

Further, in the semiconductor apparatus 120, the integrated circuits are formed in the region of the non-monocrystalline Si thin film 105' and the region of the monocrystalline Si thin film 114a. This enables the integrated circuits to be formed in suitable regions according to required configurations and characteristics. This makes it possible to provide integrated circuits having different operating speeds or different operating power supply voltages or the like in different regions. For example, integrated circuits can be designed such that at least one of gate length, thickness of gate insulating film, power supply voltage, and logic level are different between different regions. This provides a device having different characteristics between different regions, making it possible to provide a semiconductor apparatus having a variety of functions.

Further, in the semiconductor apparatus 120, the integrated circuits are formed both in the region of the non-monocrystalline Si thin film 105' and the region of the monocrystalline Si thin film 114a. This enables different processing rules to be applied to the integrated circuits formed in the respective regions. For example, different processing rules need to be applied to each different portion when the channel length is short, because in this case there will be hardly any increase in the variation of TFT characteristics, due to the absence of grain boundary in the monocrystalline Si thin film region whereas, in the polycrystalline Si thin film region, the TFT characteristics vary greatly due to the influence of grain boundary. That is, the integrated circuits can be formed in suitable regions according to the processing rule.

Further, in the semiconductor apparatus 120, the metal lead patterns for the MOS-type monocrystalline Si thin film transistor 116a can be formed according to lead forming rules having a wider tolerance than that for the gate patterns. In this way, the semiconductor apparatus in which the MOS-type monocrystalline Si thin film transistor 116a is mounted can be interconnected to external apparatuses or external leads more easily, making it possible to increase yield by preventing interconnection error with respect to external apparatus or the like.

The size of the monocrystalline Si thin film 114a formed on the semiconductor apparatus 120 is determined by the wafer size of the LSI fabricating apparatus. The wafer size of a common LSI fabricating apparatus is sufficient to realize the speed and power consumption required for the monocrystalline Si thin film 114a; the high-speed logic that must take into account variations; the timing generator; the high-speed DAC (current buffer); or the processor.

The semiconductor apparatus 120 of the present embodiment is a high-performance and multi-functional semiconductor apparatus in which the MOS-type monocrystalline Si thin film transistor 116a and the non-monocrystalline Si thin film transistor 101a are mounted on different regions of the insulating substrate 102. In the semiconductor apparatus 120, the monocrystalline Si thin film transistor 116a is mounted after the non-monocrystalline Si thin film transistor 101a is formed.

The monocrystalline Si substrate 110a for forming the monocrystalline Si thin film transistor 116a is subjected to processes for forming the MOS-type monocrystalline Si thin film transistor, before mounted on the insulating substrate 102. Specifically, after forming the gate electrode and the gate insulating film and implanting source-drain impurity ions into the P-type and N-type channel portions, an interlayer planarizing film is formed on the gate electrodes (here, $SiO_2$ is formed by CVD and BPSG after the deposition is melted) and the resulting substrate is planarized with CMP and cut into a predetermined shape. The monocrystalline Si substrate 110a having the MOS-type monocrystalline Si thin film 114a formed thereon is washed with a SC1 washing solution to remove particles and activate the surface. After position registration with the alignment marks at room temperature, the monocrystalline Si substrate 110a was mounted on the insulating substrate 102. Here, processes were made to provide a gate length of 0.35 μm, and the processing rule for the contacts and metal lead portions were selected such that the line width and spacing were 2 microns in order to accommodate photolithography accuracy of large glass substrates and alignment accuracy of bonding.

In the semiconductor apparatus 120, the MOS-type transistor is formed in the region of the non-monocrystalline Si thin film 105' and the region of the monocrystalline Si thin film 114a. The transistors of the same conduction-type formed in the respective regions differ from one another in at least one of mobility, sub-threshold coefficient, and threshold value. That is, the transistors can be formed in corresponding monocrystalline Si thin film region or non-monocrystalline Si thin film region according to desired characteristics.

The following describes a manufacturing method of the semiconductor apparatus 120 with reference to FIGS. 6(a) through 6(i).

Figure 6A:
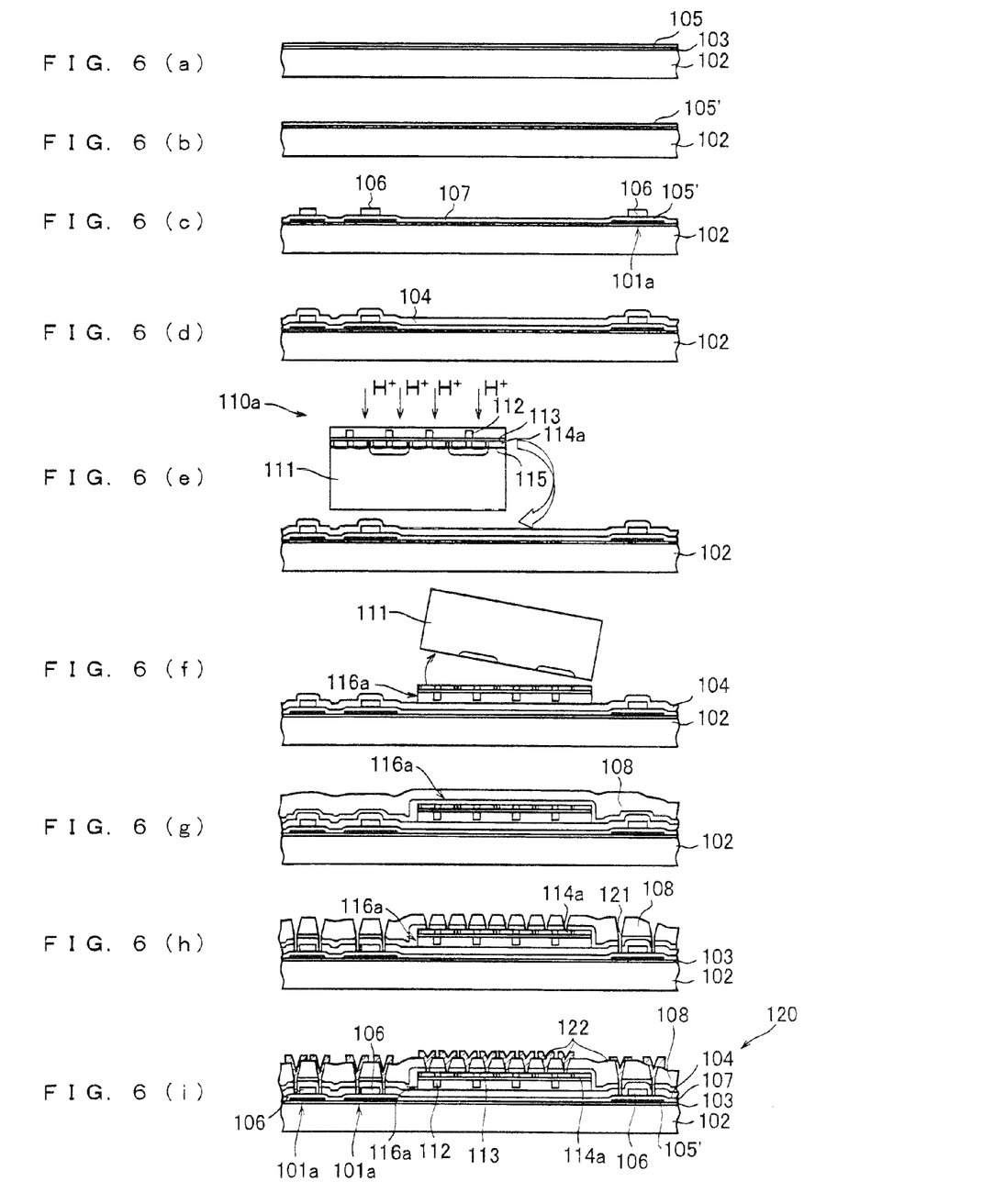
FIG. 6(a) is a cross sectional view showing a manufacturing step of a substrate including a non-monocrystalline thin film transistor and a monocrystalline thin film transistor.

As the insulating substrate 102, a high-distortion-point glass, CODE 1737 (alkali earth- alumino borosilicate glass) of Corning® is used. As shown in FIG. 6(a), the $SiO_2$ film 103, about 100 nm thick, is deposited on a surface of the insulating substrate 102 by plasma chemical vapor deposition (hereinafter "p-CVD") using a gas mixture of TEOS (TetraEthoxySilane, $Si(OC_2H_5)_4$) and $O_2$ (oxygen).

On the surface of the $SiO_2$ film 103, an amorphous Si film 105 with a thickness of about 50 nm is deposited by plasma CVD using $SiH_4$ gas.

Then, as shown in FIG. 6(b), the amorphous Si film 105 is irradiated with an excimer laser to heat and crystallize the amorphous Si film 105 and cause the polycrystalline Si layer to grow. As a result, the non-monocrystalline Si thin film 105' is formed. Note that, heating of the amorphous Si film 105' is not just limited to irradiation using an excimer laser. Alternatively, the amorphous Si film 105' may be heated, for example, by irradiation using other lasers, or by using a furnace. In order to promote crystal growth, at least one of Ni, Pt, Sn, and Pd may be added to the amorphous Si film 105'.

Then, a predetermined region of the non-monocrystalline Si thin film 105' is etched away as shown in FIG. 6(c).

Thereafter, as shown in FIG. 6(c), the gate insulating film ($SiO_2$ film) 107 of 80 to 100 nm thick is deposited for the TFT of the non-monocrystalline Si (here, polycrystalline Si or continuous grain Si), by plasma CVD using $SiH_4$ and $N_2O$ gas. Then, a gate electrode film is deposited and the gate electrode 106 is formed by patterning.

Next, as shown in FIG. 6(d), source-drain impurity ions are implanted, and the $SiO_2$ film 104 of about 50 to 250 nm thick is deposited thereon as a protective insulating film by plasma CVD, using a gas mixture of TEOS (TetraEthoxySilane, $Si(OC_2H_5)_4$) and $O_2$ (oxygen).

As described with reference to FIGS. 1(d), 4, and 5 in connection with the [Fabrication of Bonding Substrate] section above, the recessed alignment marks are formed in the substrate 102 in portions to be bonded.

In the fabrication of the semiconductor apparatus 120 of the present embodiment, the monocrystalline Si substrate 110a is fabricated to include the MOS-type transistor 116a.

By dicing or other techniques, the monocrystalline Si substrate 110a is cut into a shape slightly smaller than a predetermined region removed by etching the non-monocrystalline Si thin film 105'.

In order to remove particles and activate the surface, the insulating substrate 102 with the non-monocrystalline Si thin film 105' formed thereon is washed with SC-1, together with the monocrystalline Si substrate 110a. As shown in FIG. 6(e), the monocrystalline Si substrate 110a on the side of a hydrogen ion-implanted region 115 is aligned with the etched region at room temperature and bonded in contact with this region. SC-1 washing is a washing technique generally known as RCA washing, and it uses a washing solution whose constituents are ammonia, hydrogen peroxide, and deionized water. Bonding is made after the monocrystalline Si substrate 110a is aligned with the substrate 102 for position registration according to the technique described in the [Bonding Step] section.

Note that, the monocrystalline Si substrate 110a may be mounted on the insulating substrate 102 after the $SiO_2$ film 107 is formed as a gate insulating film, and before the $SiO_2$ film 104 is deposited as a protective insulating film.

Thereafter, a heat treatment is performed at temperatures between 300° C. and 600° C. (here, about 550° C.), so as to raise the temperature of the hydrogen-implanted region 115 of the monocrystalline Si substrate 110a at or above the temperature at which hydrogen is released from the monocrystalline Si. This enables the monocrystalline Si substrate 110a to be split open, using the hydrogen-implanted region 115 as the boundary. As a result, the base portion 111 is detached from the monocrystalline Si thin film 114a. By thus removing the base portion 111 from the monocrystalline Si substrate 110a, the monocrystalline Si thin film transistor 116a is formed. Note that, the heat treatment may alternatively performed by a method in which the temperature of the hydrogen implanted region 115 of the monocrystalline Si substrate 110a is raised by irradiation of a laser, or by lamp annealing having a peak temperature at or greater than about 700° C.

Then, the damaged layer on the surface of the monocrystalline Si substrate 110a, remaining on the insulating substrate 102 by detaching, is removed by light etching to about 20 nm, using isotropic plasma etching or wet etching (here, isotropic plasma etching). As a result, as shown in FIG. 6(f), the non-monocrystalline Si thin film 105' and the monocrystalline Si thin film 114a, each having a thickness of about 50 nm, are formed on the insulating substrate 102 constituting a single piece of substrate. Note that, undesirable peeling associated with splitting of the monocrystalline Si substrate 110a was reduced when the monocrystalline Si substrate 110a was split open after the monocrystalline Si substrate 110a bonded on the insulating substrate 2 at room temperature was subjected to a heat treatment for about 30 minutes at 300° C. to 350° C. and then a heat treatment of about 550° C.

The strength of Si-substrate bonding is already sufficient at this point. However, in order to improve bonding strength, a lamp annealing process is performed for 1 minute at about 800° C. This process may be performed to also activate the implanted source-drain impurity.

Thereafter, as shown in FIG. 6(g), a $SiO_2$ film 108 is deposited as an interlayer planarizing insulating film, and contact holes 121 are formed as shown in FIG. 6(g). Then, metal (AlSi) leads 122 are formed on the contact holes 21, as shown in FIG. 6(i).

As described above, in the manufacturing method of a semiconductor apparatus according to the present embodiment, the monocrystalline Si thin film transistor 116a is mounted after the non-monocrystalline Si thin film transistor 101a is formed. This simplifies the fabrication steps and prevents contamination of the monocrystalline Si thin film, compared with the semiconductor apparatus in which the monocrystalline Si thin film transistor is mounted first.

The example embodiment is not limited to the above, but may be altered by a skilled person within the scope of the claims. An embodiment based on a proper combination of technical means disclosed in different embodiments is encompassed in the technical scope of the example embodiment presented herein.

INDUSTRIAL APPLICABILITY

In a semiconductor apparatus of the example embodiment presented herein, desirable bonding can be realized between substrate and semiconductor device. A semiconductor apparatus of the example embodiment can therefore be used to improve reliability of various semiconductors.

The invention claimed is:

1. A semiconductor apparatus comprising an insulating substrate and a semiconductor device bonded to a surface of the insulating substrate,
   wherein:

the insulating substrate has one or more recessed portions formed within a body of the insulating substrate as an alignment mark for position registration of the semiconductor device;

every recessed portion formed within the body of the insulating substrate is provided over a region covered with the semiconductor device and a region not covered with the semiconductor device; and every recessed portion is an "L" or "T" shape with a depth of 200 nm to 300 nm.

2. The semiconductor apparatus as set forth in claim 1, wherein the recessed portion is formed by etching part of the surface of the insulating substrate.

3. The semiconductor apparatus as set forth in claim 1, wherein the semiconductor device includes a monocrystalline silicon substrate as a base portion to be detached from the semiconductor device.

4. The semiconductor apparatus as set forth in claim 1, wherein the semiconductor device has one or more recessed portions formed thereon, which are mapped with the one or more recessed portions of the insulating substrate when the semiconductor device and the insulating substrate are aligned with each other.

5. A method for manufacturing a semiconductor apparatus including an insulating substrate and a semiconductor device bonded to a surface of the insulating substrate, the method comprising:

forming one or more recessed portions on the insulating substrate, the recessed portions being formed within a body of the insulating substrate as an alignment mark for position registration of the semiconductor device;

bonding the semiconductor device on the surface of the insulating substrate so that at least part of every recessed portion formed within the body of the insulating substrate comprises a region not covered with the semiconductor device, and every recessed portion is an "L" or "T" shape with a depth of 200 nm to 300 nm.

6. The method as set forth in claim 5, wherein, in the bonding, the semiconductor device, formed on a base portion made of monocrystalline silicon, is bonded on the surface of the insulating substrate, the method further comprising detaching the base portion from the semiconductor device after the bonding.

7. The method as set forth in claim 6, further comprising forming an ion-implanted region in a region of monocrystalline silicon formed between the base portion and the semiconductor device, the ion-implanted region forming being carried out before the bonding, wherein, in the detaching, the ion-implanted region is heated to detach the base portion from the semiconductor device using the ion-implanted region as a boundary.

8. A semiconductor apparatus which is fabricated by the method of claim 5.

9. The method as set forth in claim 5, wherein the semiconductor device has one or more recessed portions formed thereon, which are mapped with the one or more recessed portions of the insulating substrate when the semiconductor device and the insulating substrate are aligned with each other.

* * * * *